(12) United States Patent
Chang et al.

(10) Patent No.: US 6,316,821 B1
(45) Date of Patent: Nov. 13, 2001

(54) HIGH DENSITY LEAD FRAMES AND METHODS FOR PLASTIC INJECTION MOLDING

(75) Inventors: Bo Soon Chang, Cupertino; Dagmar Beyerlein, San Francisco, both of CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/162,107

(22) Filed: Sep. 28, 1998

(51) Int. Cl.[7] .................................................. H01L 23/495
(52) U.S. Cl. ............................................ 257/666; 257/787
(58) Field of Search .................................. 257/666, 787, 257/667, 670

(56) References Cited

U.S. PATENT DOCUMENTS

| | | | |
|---|---|---|---|
| 5,750,153 | * 5/1998 | Shibata | 425/116 |
| 5,763,829 | 6/1998 | Tomita et al. | 174/52.2 |
| 5,811,875 | 9/1998 | Jeong et al. | 257/672 |
| 6,144,088 | * 11/2000 | Pohl et al. | 257/666 |

* cited by examiner

*Primary Examiner*—Roy Potter

(57) ABSTRACT

A lead frame assembly includes one or more lead frames each defining a plurality of package locations organized in rows and columns. An injection molding system includes a plurality of culls, each cull being connected to the frame(s) through a plurality of subrunners. Each subrunner delivers molding compound from one of the culls to a respective column of package locations. A plurality of through gates are disposed between adjacent package locations within each column, each through gate supplying molding compound from one package location to a next adjacent package location within the column, each package location being filled with molding compound in turn from the preceding package location. The need for subrunners between adjacent columns of package locations is eliminated, allowing a higher density of package locations within the lead frame(s), reducing materials and labor costs, and increasing manufacturing productivity.

12 Claims, 5 Drawing Sheets

HIGH DENSITY LEAD FRAMES AND METHODS FOR PLASTIC INJECTION MOLDING

BACKGROUND OF THE INVENTION

1. Field of the Invention

This invention relates to high density lead frames and methods for plastic injection molding. More particularly, the present invention relates to high density lead frames and methods for plastic injection molding that minimize waste of both the lead frame material and the plastic injection molding material, while increasing manufacturing productivity.

2. Description of the Related Art

Semiconductor integrated circuits are usually mounted on lead frames, each circuit thereafter being encapsulated in a plastic package formed by an injection molding process. FIG. 1 shows an example of a first generation of a lead frame assembly 100. The lead frame assembly 100 includes a first lead frame 110 and a second lead frame 140. The first and the second lead frames 110, 140 are connected by an injection molding assembly 105. The injection molding assembly 105 includes a plurality of culls 115 through which the molding compound (not shown) travels. The molding compound is injected into each of the culls 115 and travels through pairs of subrunners 120 formed during the molding process to the first and second lead frames 110, 140. The subrunners 120 are shaped like tunnels through which the molding compound flows. The molding compound, initially in powder form, is heated to about 175° C., at which temperature the powder compound becomes a liquid. The hot liquid molding compound is then injected through an opening in the culls 115 and forced to flow through the subrunners 120. The molding compound flows through the subrunners 120 until the gates 125, also generally tunnel-shaped, are reached, the gates 125 guiding the molding compound to the mold location where the individual packages 130 are to be formed. The molding compound then forms the individual packages 130, encapsulating the integrated circuits therein in individual packages, leaving the leads 132 protruding therefrom. In FIG. 1, the packages 130 can be seen to be oriented with their leads 132 oriented perpendicularly to the long axes 150 of the first and second lead frames 110, 140.

As shown in FIG. 1, the first and the second lead frames 110, 140 each support five pairs of packages 130, each pair of packages 130 having been supplied with molding compound by a single subrunner 120 and a gate 125. The lead frame assembly 100 of FIG. 1 thus creates twenty such packages 130, ten packages 130 in each of the first and second lead frames 110, 140. The packages 130 are then trimmed from the first and second lead frames 110, 140, the leads 132 appropriately bent and shaped, and the packages 130 separated from one another in a simulation process.

The first and second lead frames 110, 140 are formed of copper or of a copper alloy. After the simulation process, all but the packages 130 themselves are discarded. Indeed, the remaining portions of the first and second lead frames 110, 140 are discarded, as is the injection molding assembly 105, including the culls 115, the subrunners 120 and the gates 125. Because of the design and layout of the lead frame assembly 100, a great deal of lead frame material and injection molding assembly 105 is thrown out, thus significantly adding to the cost of the end product. Moreover, because of the low density of packages 130 on each of the first and second lead frames 110, 140, labor costs are high and manufacturing yield is low, both also contributing to increased unit cost of the packages 130.

In an effort to reduce material waste and labor costs and to increase manufacturing yield, the lead frame assembly 200 of FIG. 2A has been developed. FIG. 2A shows the lead frame assembly 200 with a plurality of packages 230 molded thereon. The lead frame assembly 100 of FIG. 2A includes a first and a second lead frame 210, 240 joined by an injection molding assembly 205. The structure of the injection molding assembly 205 is similar to that of its counterpart 105 in FIG. 1, and includes a plurality of centrally located culls 215 through which the molding compound (not shown) is injected. The molding compound is injected into each of the culls 215 and travels through pairs of subrunners 220 formed by the mold to the first and second lead frames 210, 240. The subrunners 220 are generally tunnel-shaped structures through which the molding compound flows. The molding compound flows through the subrunners 220 until it reaches the gates 225 (also generally tunnel-shaped), the gates 225 guiding the molding compound to the location where the individual packages 230 are to be formed. The molding compound then fills these locations to encapsulate the integrated circuits therein to form the individual packages 230, leaving the leads 232 protruding therefrom. In FIG. 2A, the individual packages 230 can be seen to be again oriented with their respective leads 232 oriented generally perpendicularly to the long axes 250 of the first and second lead frames 210, 240.

The lead frame assembly 200 shown in FIG. 2A is designed to support a higher number of packages 230 than its predecessor lead frame assembly 100 of FIG. 1. Indeed, each subrunner 220 of FIG. 2A is connected to three gates 225, each gate 225 supplying a pair of packages 230. Therefore, each subrunner 220 supplies molding compound to 6 separate packages 230. The lead frame assembly 200 depends upon a network of subrunners disposed squarely within the confines of the lead frames 210, 240 to form pairs of packages 230.

The first and second lead frames 210, 240 are formed of copper or of a copper alloy. After the simulation process referred to above, all but the packages 230 are discarded. Indeed, the remaining portions of the first and second lead frames 210, 240 are discarded, as is the injection molding assembly 205, including the cuffs 215, the subrunners 220 and the gates 225 joining pairs of packages 230. Because of the architecture of the lead frame assembly 200, much lead frame material and injection molding assembly 205 is discarded, thus again significantly adding to the cost of the end product. Moreover, because of the low density of packages 230 on each of the first and second lead frames 210, 240, labor costs are high and manufacturing yields low, albeit not as high nor as low, respectively, as with the lead frame assembly 100 discussed relative to FIG. 1.

FIG. 2B shows a lead frame 210, before the packages 230 (shown in FIG. 2A) are molded thereon. As shown in FIG. 2B, the die attach pads 231, the pads onto which the semiconductor die or dice is to be attached, are oriented in such a manner that the leads 232 extend generally perpendicularly relative to the long axis 250 of the lead frame 210. As shown in both FIGS. 2A and 2B, the die attach pads 231 and their corresponding packages 230 shown in FIG. 2A are organized in rows and columns. Indeed, the rows of die attach pads 231 are parallel to the long axis 250 of the lead frame 210 (and 240 in FIG. 2A), whereas the columns thereof are perpendicular thereto. Each column of die attach pads 231 is separated from its next adjacent column by a space called a street, shown in FIG. 2B at reference numeral 260. The streets 260 may be perforated, as shown in FIG. 2B, to reduce the amount of lead frame material (e.g., copper) needed. The streets 260 include notches 265 for the gates 225 through which the liquid molding compound emerges to form the packages 230.

The streets 260 provide the space and necessary support for the subrunners 220 and the gates 225. To accommodate the network of subrunners 220 and gates 225 shown in FIG. 2A, the die attach pads 231 and their corresponding packages 230 must necessarily be separated by a substantial space. Such space inherently precludes a greater unit density on the lead frames 210, 240 and leads to manufacturing inefficiencies. Indeed, after the simulation process is carried out, the injection molding assembly 205 and the remaining lead frame materials are simply discarded, at great cost to the manufacturer and ultimately to the consumer of the end devices. Moreover, the generation of such a quantity of waste materials may have an adverse affect upon the environment, unless disposed of properly and/or recycled to the extent possible.

What is needed, therefore, is a high-density lead frame for plastic injection molding that increases the density of packages on the lead frames. What is also needed is a lead frame and injection molding assemblies and methods that minimize the amount of material that must be discarded after the simulation process is carried out. What is also needed is a novel lead frame design that minimizes some of the environmental impacts of the manufacture of semiconductor devices.

SUMMARY OF THE INVENTION

An object of the present invention, therefore, is to provide a high-density lead frame for plastic injection molding that increases the density of packages on lead frames. Another object of the present invention is to provide lead frame and injection molding assemblies and methods that minimize the amount of material (of both the lead frame and the injection molding assembly) that must be discarded after the simulation process is carried out. It is a further object of the present invention to provide a novel lead frame design that minimizes some of the environmental impacts of the manufacture of semiconductor devices.

In accordance with the above-described objects and those that will be mentioned and will become apparent below, a lead frame assembly, according to an embodiment of the present invention, comprises:

a lead frame, the lead frame defining a plurality of package locations organized in rows and columns;

a plurality of culls, each cull being connected to the lead frame through a plurality of subrunners, each subrunner being adapted to deliver molding compound from one of the culls to a respective column of package locations; and a plurality of through gates, each through gate being adapted to supply molding compound from one package location to a next adjacent package location within a column.

According to further embodiments, each cull is connected to each of a first and a second lead frame through a plurality of subrunners. Each package location may include a plurality of leads oriented generally along a long axis of the lead frame. The plurality of culls and the plurality of through gates may be configured to supply, for each column, molding compound through each package location in turn. The plurality of culls and the plurality of through gates may be configured to cause the molding compound to flow, within a predetermined column, through a first package location and from the first package location to adjacent package locations. The first package location may be that package location that is closest to a cull supplying a column to which the first package location belongs. Each subrunner may extend from its respective cull only as far as necessary to supply molding compound to a nearest package location of its respective column. Each cull may include at least two subrunners for each lead frame. Each lead frame may include at least 6 rows of package locations. Each cull may provide molding compound to at least 18 package locations for each lead frame.

The present invention may also be viewed as a method of encapsulating package locations of a lead frame with molding compound, comprising the steps of:

injecting at least one cull with molding compound; and constraining the molding compound to flow from the cull through each package location of a column of package locations in turn, each package location supplying molding compound to a next adjacent package location within the column.

According to still further preferred embodiments, the constraining step may include a step of forming a through gate between each adjacent package location within each column, the through gate channeling the molding compound between adjacent package locations. The constraining step may include a step of forming a plurality of subrunners connecting each cull to a respective column of package locations. The subrunners formed in the forming step may extend only as far as a nearest package location of the column to which the subrunner is connected.

According to another embodiment, a lead frame for plastic injection molding, according to the present invention, comprises:

a plurality of package locations organized in rows and columns, each location including a plurality of leads oriented generally along a long axis of the lead frame;

a through gate location between each adjacent package location of each column, each through gate location being configured to allow formation of a through gate adapted to channel molding compound from one package location to a next adjacent package location within a column.

BRIEF DESCRIPTION OF THE DRAWINGS

For a further understanding of the objects and advantages of the present invention reference should be made to the following detailed description, taken in conjunction with the accompanying figures, in which.

DESCRIPTION OF THE PREFERRED EMBODIMENTS

Figure 3A:
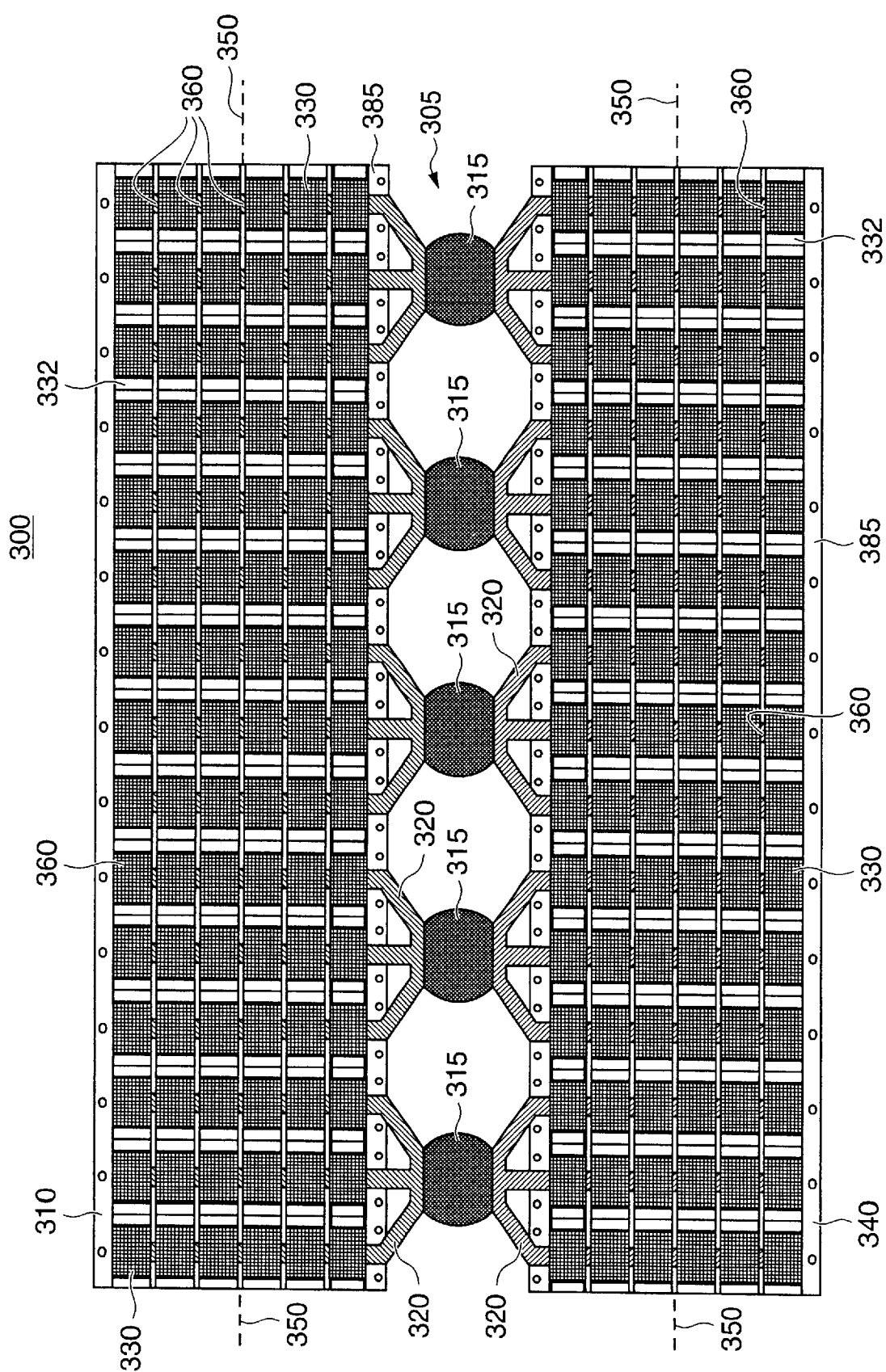
FIG. 3A shows a lead frame assembly having a plurality of packages molded thereon, according to an embodiment of the present invention.
Figure 3B:
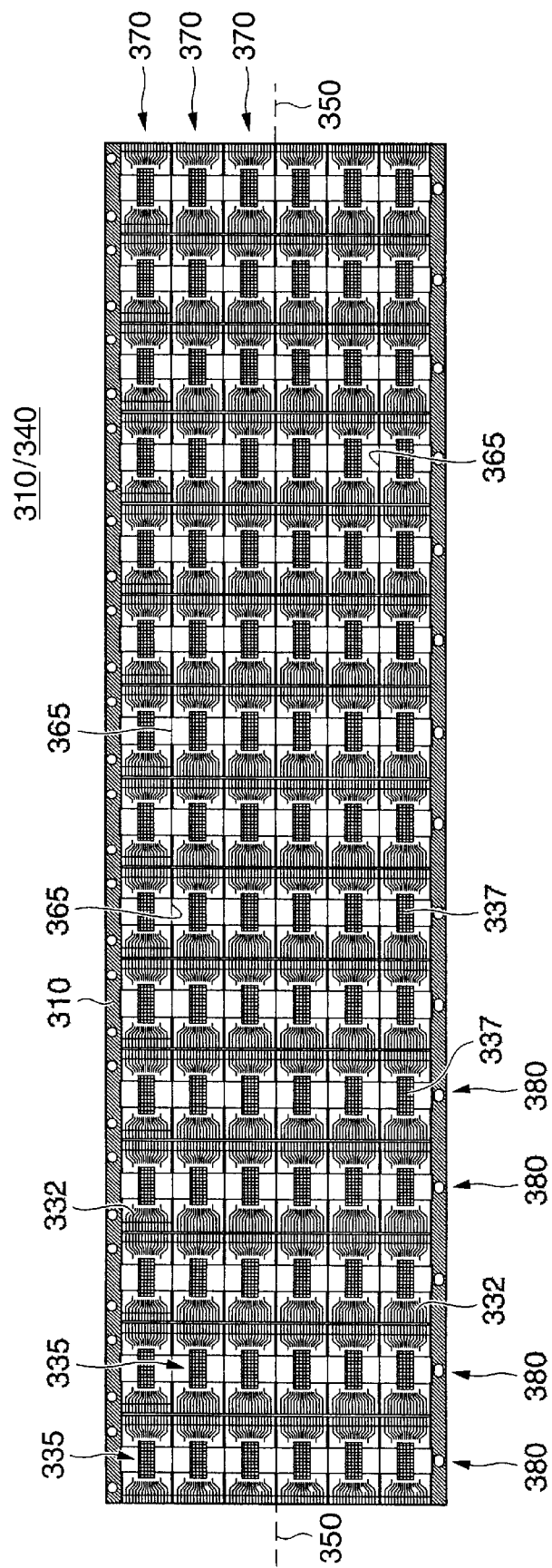
FIG. 3B shows one of the lead frames of FIG. 3A, before the injection molding process, according to an embodiment of the present invention.

FIG. 3A shows a lead frame assembly 300 having a plurality of packages 330 molded thereon, according to an embodiment of the present invention. FIG. 3B shows the lead frame 310 (or 340) of FIG. 3A, before the packages 330 of FIG. 3A are molded thereon, according to an embodiment of the present invention. Considering now FIGS. 3A and 3B collectively, the lead frame assembly 300 of FIG. 3A includes a first lead frame 310 and a second lead frame 340 joined by an injection molding assembly 305. The injection molding assembly 305 includes a plurality of culls 315 through which molding material (not shown) may be injected to form the packages 330. The packages 330 are formed at package locations 335, each of which includes a plurality of leads 332 and a die attach pad 337 to which a semiconductor die may be attached. The plurality of leads 332, according to the present invention, are preferably oriented generally along the long axis 350 of the lead frame 310 or 340. The package locations 335, and thus the resulting packages 330, are organized in a plurality of rows 370 and columns 380.

Figure 2A:
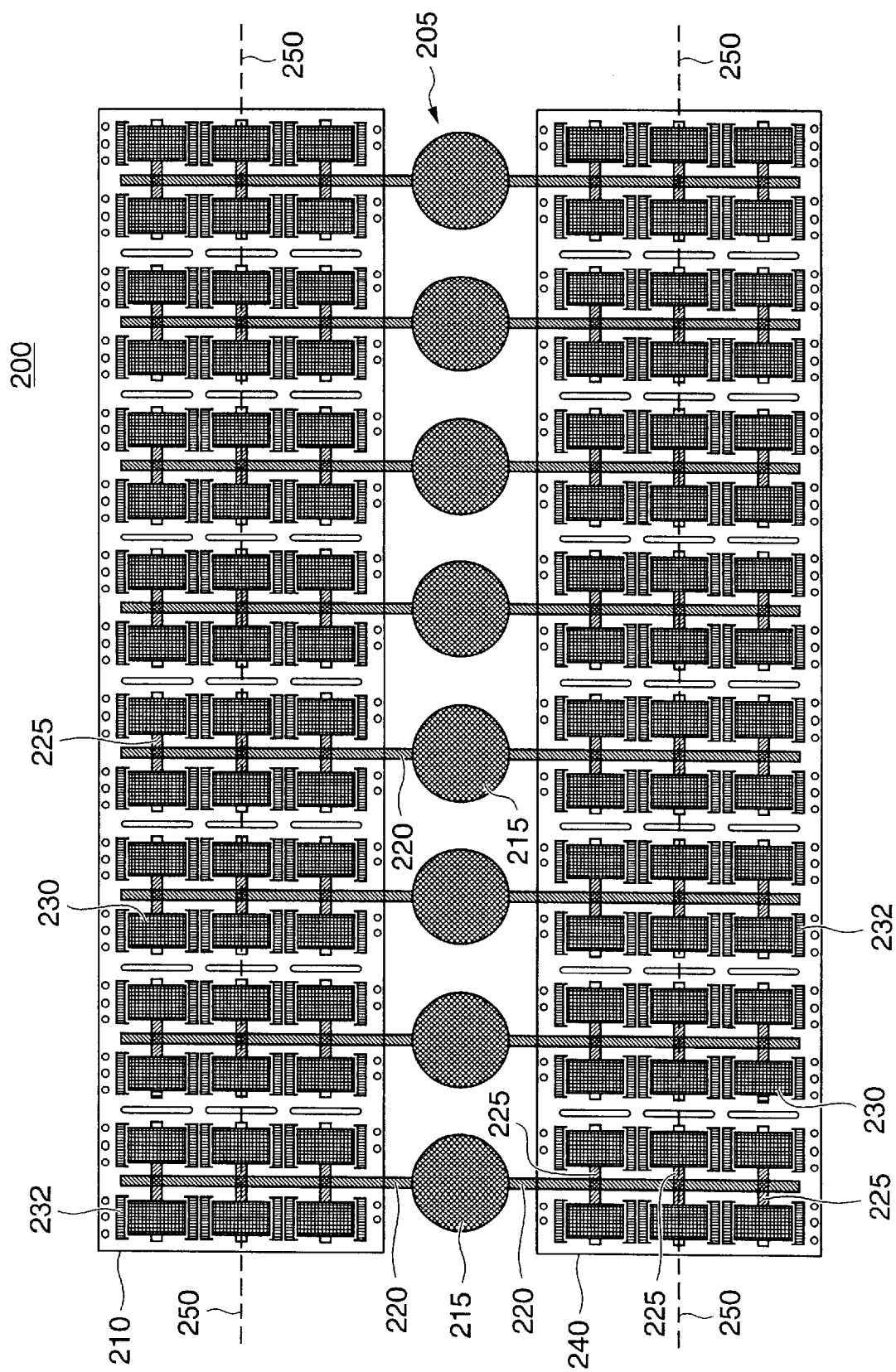
FIG. 2A shows another lead frame assembly having a plurality of packages molded thereon.

During the semiconductor manufacturing process, a silicon die or dice is attached to each of the die attach pads 337 of the package locations 335 using, for example, conventional die attach technology. The wire bonding process using, for example, gold wire, is carried out to connect pads on the die to the leads 332 by, for example, conventional thermosonic compression wire bonding technology. The wire bonded lead frames are then ready for the injection molding process, wherein hot liquefied molding compound is injected into each of the culls 315 and constrained by the mold (not shown) in such a manner as to form subrunners 320. A plurality of subrunners 320 connect each of the culls 315 to each of the first and second lead frames 310, 340. The subrunners 320 each deliver molding compound from one of the culls 315 to a respective column 380 of the first and second lead frame 310, 340. However, unlike the subrunners 220 of FIG. 2A that penetrate deep within the lead frames 210, 240 (wasting both lead frame space and materials, as well as molding compound), each of the subrunners 320 of FIG. 3A extends only as far as necessary to supply molding compound to the nearest package location 335 of the column 380 to which it is connected. Thus, the subrunners 320 do not extend within the lead frames 310, 340 further than is necessary to supply the aforementioned single nearest package location 335. Indeed, the subrunners 320, according to the present invention, do not extend substantially past the handling rails 385 of the first and second lead frames 310, 340.

As the subrunners 320 according to the present invention do not deliver molding compound to each of the package locations 335, the molding compound must follow some pathway to flow from one package location 335 to a next adjacent package location 335 within a column 380 of such package locations 335. This function is discharged by the through gates 360 shown in FIG. 3A Indeed, each through gate 360 is adapted to supply molding compound from one package location 335 to a next adjacent package location 335 within a column 380. For each column 380, therefore, the through gates 360 supply molding compound through each package location 335 in turn.

As shown in FIG. 3A, each subrunner 320 supplies a single column 380 of either the first or second lead frames 310, 340. For each column 380, the molding compound is first supplied to the package location 335 closest to the culls 315. After that closest package location 335 is substantially filled with molding compound, the through gate 360 between that closest package location 335 and the next adjacent and next closest package location 335 within the same column 380 channels the molding compound to the next adjacent package location 335. In this manner, each package location 335 within each column 380 is filled with molding compound, each package location 335 of each column 380 being filled in turn from the preceding package location 335, as the compound flows in the through gate 360 joining the two.

Figure 1:
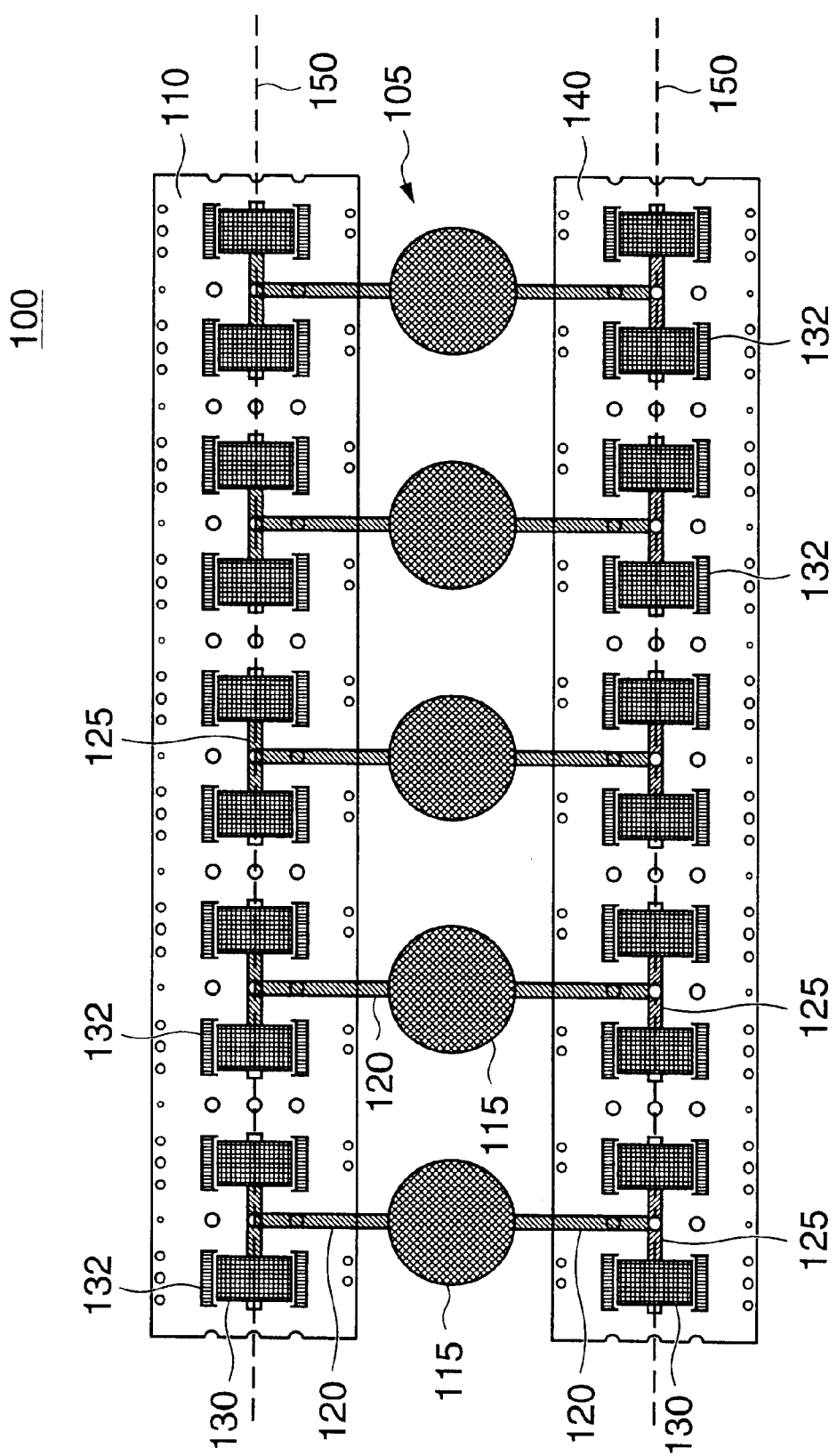
FIG. 1 shows a lead frame assembly having a plurality of packages molded thereon.
Figure 2B:
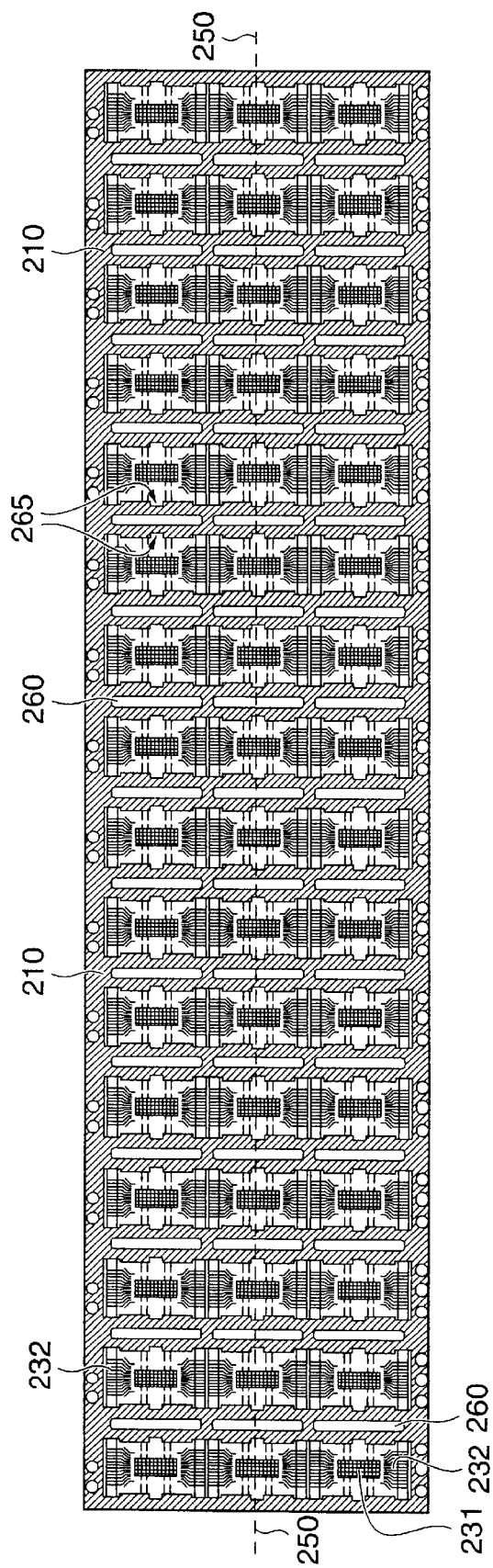
FIG. 2B shows one of the lead frames of FIG. 2A, before the injection molding process.

The presence of the through gates 360 and the orientation of the package locations 335 wherein the leads thereof are oriented substantially along the long axis 350 of the lead frame 310, 340 (as opposed to perpendicular thereto as in FIGS. 1 and 2A and 2B), allows for a substantial increase in the density of the package locations 335 within the lead frames 310, 340. Indeed, the present invention allows up to about a 73% reduction of lead frame material (such as copper) per package location 335, as compared to the lead frame assembly 100 shown in FIG. 1 and about a 40% reduction of lead frame material, as compared to the lead frame assembly 200 shown in FIG. 2A. Moreover, the lead frame architecture of the present invention allows the subrunners 120, 220 within the lead frames to be all but eliminated, as the package locations 335 themselves form a portion of the molding compound delivery system. Indeed, the package locations 335 channel the molding compound from one location 335 to the next location 335, the package locations 335 within each column 380 being only separated by a narrow through gate 360 allowing the compound to flow between adjacent package locations 335. As the present invention eliminates the need for subrunners between adjacent columns 380 of package locations 335, a great saving of molding compound is also achieved, on the order of a reduction of about 50% as compared to the architecture shown in FIG. 1 and about a 30% reduction of molding material required, as compared to the lead frame assembly 200 shown in FIG. 2A.

As shown in FIG. 3A, each cull 315 may be connected to three subrunners 320 for each of the first and second lead frames 310, 340, for a total of six subrunners 320 per cull 315. Alternatively, each cull 315 may be connected to a smaller or greater number of such subrunners 320. As shown in the embodiment of FIGS. 3A and 3B, each lead frame may accommodate six rows 370 and 15 columns 380 of package locations 335. Other numbers of rows 370 and columns 380 are possible. Limiting factors on the number of rows may include, for example, the ability of the molding compound to flow from the first, or closest package location 335 to the last or farthest package location without hardening, or losing its ability to homogeneously fill the package locations 335. Another limitation on the size of the lead frames 310, 340 may include, for example, the size of the molding machine used to secure the lead frames 310, 340 and inject the molding compound therein. In the embodiment shown in FIGS. 3A and 3B, each lead frame 310, 340 includes ninety package locations 335, organized as six rows and fifteen columns, each cull 315 providing molding compound, through appropriate subrunners 320, to eighteen package locations 335 for each lead frame 310, 340, for a total of 36 package locations 335. Other architectures are possible and should be deemed to fall within the scope and spirit of the present invention. The present invention is well suited to improve the unit density of, for example, Thin Outline Small Semiconductor Packages (TSOP), although semiconductor packages having different profiles and characteristics will also benefit from the present invention. Indeed, most any process wherein unit density, material and labor costs and manufacturing efficiency are important will benefit from the inventive lead frames and encapsulation methods according to the present invention.

While the foregoing detailed description has described preferred embodiments of the present invention, it is to be understood that the above description is illustrative only and not limiting of the disclosed invention. For example, a different number of culls may be advantageously employed to supply the package locations 335 with molding compound. Still other modifications may occur to those of skill in this art. Thus, the present invention is to be limited only by the claims as set forth below.

What is claimed is:

1. An injection molding assembly for use with a lead frame assembly comprising a lead frame, the lead frame defining a plurality of package locations organized in rows and columns, the injection molding assembly comprising:

a plurality of cavities, each cavity corresponding to a package location of the lead frame;

a plurality of culls;

a plurality of subrunners, wherein each cull is connected to a cavity through a plurality of subrunners, each subrunner being adapted to deliver molding compound from one of the culls to a respective set of cavities corresponding to a column of package locations; and a plurality of through gates, each through gate being adapted to supply molding compound from one cavity to a next adjacent cavity of a set of cavities corresponding to a column of package locations.

2. The injection molding assembly of claim 1, wherein each cull is connected to each of a plurality of cavities through a plurality of subrunners.

3. The injection molding assembly of claim 1, wherein each package location includes a plurality of leads oriented generally along a long axis of the lead frame.

4. The injection molding assembly of claim 1, wherein the plurality of culls and the plurality of through gates are configured to supply, for each package location of a column, molding compound through each cavity corresponding to each package location in turn.

5. The injection molding assembly of claim 4, wherein the plurality of culls and the plurality of through gates are configured to cause the molding compound to flow, within a predetermined column, through a first cavity corresponding to a first package location and from the first cavity to adjacent cavities corresponding to package locations adjacent to the first package location.

6. The injection molding assembly of claim 5, wherein the first cavity is closest to a cull supplying molding compound to a column to which the first cavity belongs.

7. The injection molding assembly of claim 1, wherein each subrunner extends from its respective cull only as far as necessary to supply molding compound to a nearest cavity corresponding to a package location of a column the package locations of which are to be encapsulated by molding compound from the cull.

8. The injection molding assembly of claim 1, wherein each cull supplies molding compound through at least two subrunners for each cavity.

9. The injection molding assembly of claim 1, wherein each lead frame includes at least 6 rows of package locations.

10. The injection molding assembly of claim 1, wherein each cull provides molding compound to at least 18 cavities.

11. A lead frame for use in plastic injection molding, comprising:

a plurality of package locations organized in rows and columns, each location including a plurality of leads oriented generally along a long axis of the lead frame; and a through gate location between each pair of adjacent package locations of each column, each through gate location being configured to allow formation of a through gate adapted to channel molding compound from one package location to a next adjacent package location within a column.

12. An injection molding assembly for use in encapsulating a plurality of semiconductor devices located at a plurality of package locations of a lead frame, the injection molding assembly comprising:

a plurality of cavities, each cavity corresponding to a package location of the lead frame;

a cull;

a subrunner, wherein the cull is connected to a first cavity through the subrunner, the subrunner being adapted to deliver molding compound from the cull to the first cavity; and a through gate, the through gate being adapted to supply molding compound from the first cavity to a second cavity adjacent to the first cavity.

* * * * *